(12) United States Patent
Chen

(10) Patent No.: US 6,337,588 B1
(45) Date of Patent: Jan. 8, 2002

(54) APPARATUS AND METHOD FOR DOUBLING THE FREQUENCY OF A CLOCK SIGNAL

(75) Inventor: Kong-Chen Chen, San Jose, CA (US)

(73) Assignee: Oak Technology, Inc., Sunnyvale, CA (US)

(*) Notice: Subject to any disclaimer, the term of this patent is extended or adjusted under 35 U.S.C. 154(b) by 0 days.

(21) Appl. No.: 09/118,641

(22) Filed: Jul. 17, 1998

(51) Int. Cl.[7] ............................................... H03B 19/00
(52) U.S. Cl. ...................................... 327/122; 327/116
(58) Field of Search ................................... 327/113, 116, 327/119, 121, 122

(56) References Cited

U.S. PATENT DOCUMENTS 4,634,987 A   1/1987   Nolte ......................... 328/160
5,111,066 A   5/1992   Artieri et al. ................ 307/271

OTHER PUBLICATIONS

"Digital High Frequency Doubler Circuit", *IBM Technical Disclosure Bulleting*, 25(3A):1146–1147, XP–002117728, Aug. 1982.

*Primary Examiner*—Toan Tran
*Assistant Examiner*—Cassandra Cox
(74) *Attorney, Agent, or Firm*—Pennie & Edmonds LLP

(57) ABSTRACT

A circuit for doubling the frequency of a periodic input signal includes an input stage to produce a first signal pulse during a first half of a first cycle of the periodic input signal and a second signal pulse during a second half of the first cycle of the periodic input signal. A reset stage produces a first reset signal that terminates the first signal pulse and a second reset signal that terminates the second signal pulse. The first signal pulse and the second signal pulse form a two cycle output signal during the first cycle of the periodic input signal.

18 Claims, 4 Drawing Sheets

APPARATUS AND METHOD FOR DOUBLING THE FREQUENCY OF A CLOCK SIGNAL

BRIEF DESCRIPTION OF THE INVENTION

This invention relates generally to clock signals used in digital systems. More particularly, this invention relates to a technique for establishing an adaptive clock pulse width for a frequency doubled clock signal used in a digital system.

BACKGROUND OF THE INVENTION

The Nyquist theorem establishes that an analog input signal must be sampled at least two times per cycle in order to re-construct the signal. Thus, a digital signal processor may rely upon a higher frequency clock signal to latch a sampled signal at least two times per cycle. A doubled clock signal is therefore used in a variety of signal processing applications.

A doubled clock signal is also used in other types of digital systems. For example, different domains of a digital system may operate at different clock frequencies. That is, one portion of a digital system may operate at a base clock frequency, while a second portion of the digital system may operate at a frequency that is double the base clock frequency.

FIG. 1 illustrates a prior art circuit used to double the frequency of a system clock (CLK). The circuit of FIG. 1 produces an output clock signal at twice the frequency of its input clock signal The circuit of FIG. 1 relies upon an exclusive-OR gate 50. As known in the art, a two input exclusive-OR gate 50 produces a digital high signal if only one of its input signals is high, otherwise it produces a digital low signal. In other words, for a two bit input pattern, a digital high signal is generated if the two bit input signal is 01 or 10, and a digital low signal is generated if the input signal is 00 or 11.

The timing diagram of FIG. 2 demonstrates the operation of the circuit of FIG. 1. Waveform 60 is an input clock whose frequency is to be doubled. When the input clock signal on node 52 goes to a digital high value, the exclusive-OR gate immediately generates a digital high output signal, as shown with waveform 62. The input clock signal is applied to a delay line 54. By way of example, the delay line 54 may be implemented with a set of inverters. The digital high input clock signal is delayed by the delay line 54, and is then delivered to input node 56 of the exclusive-OR gate 50. At this point, the exclusive-OR gate 50 has two digital high input signals. Thus, its output goes to a digital low value, as shown with waveform 62. This digital low output signal persists until the input clock signal changes state.

When the input clock signal 60 goes to a digital low state, the exclusive-OR gate 50 has a digital low signal on node 52 and a delayed digital high signal on node 56. Thus, the circuit 50 produces a digital high signal, as shown with waveform 62. This digital high signal persists until the digital high state preserved by the delay line 54 transitions. Once this transition occurs, the exclusive-OR gate 50 receives two digital low signals, and consequently produces a digital low output signal for the remainder of the first cycle of the input clock, as shown in FIG. 2. This processing pattern is repeated for subsequent signal cycles.

Thus, the circuit of FIG. 1 produces an output signal at a frequency twice that of its input signal. The pulse width generated by the circuit of FIG. 1 is determined by the value of the delay line 54. The larger the value of the delay line 54, the wider the pulse width.

The drawback of this prior art clock doubling scheme is that voltage variations, temperature variations, and integrated circuit process parameter variations can cause large variations in the pulse width. These pulse width variations can cause a number of problems. For example, if the pulse width is too narrow, the pulse may fail to turn-on slave stage flip-flops at the appropriate time. As a result, data is not clocked into the flip-flops at the appropriate time. When the pulse width is too large, the logic low state may be too small (narrow) to be recognized, thus the pulse width fails to turn-on the master stage of a flip-flop to process new data. The impact of pulse width variations becomes more severe at high speeds.

Another prior art scheme for doubling a clock frequency is a phase-locked loop. A phase-locked loop is a relatively complicated device that uses a phase detector, a charge pump, a capacitor, and a voltage controlled oscillator to produce a frequency shifted signal. The expense associated with these relatively complicated devices precludes their use in many applications.

In view of the foregoing, it would be highly desirable to have a reliable low cost solution to doubling the frequency of an input clock signal. Such a circuit should be able to generate a 2× clock with a minimum pulse width sufficient to trigger digital components and be able to adaptively adjust for voltage, temperature, and process variations. Ideally, such a circuit would utilize standard components for each implementation. The circuit should also be easily integrated into an integrated circuit

SUMMARY OF THE INVENTION

The apparatus of the invention includes a circuit for doubling the frequency of a periodic input signal. The circuit includes an input stage to produce a first signal pulse during a first half of a first cycle of the periodic input signal and a second signal pulse during a second half of the first cycle of the periodic input signal. A reset stage produces a first reset signal that terminates the first signal pulse and a second reset signal that terminates the second signal pulse. The first signal pulse and the second signal pulse form a two cycle output signal during the first cycle of the periodic input signal.

The method of the invention includes the step of generating a first signal pulse during a first half of a first cycle of an input clock signal. A first reset signal is produced in response to the first signal pulse. The first reset signal operates as a feedback signal that terminates the first signal pulse and the first reset signal. A second signal pulse is formed during a second half of a first cycle of the input clock signal. A second reset signal is provided in response to the second signal pulse. The second reset signal operates as a feedback signal that terminates the second signal pulse and the second reset signal. Thus, a two cycle output clock signal is formed during the first cycle of the input clock signal.

The invention provides a low-cost clock doubling circuit that utilizes standard components for easy implementation. Advantageously, the circuit provides an adaptive pulse width that insures proper signal latching. The adaptive pulse width provided by the circuit of the invention results in immunity from voltage, temperature, and process variations.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
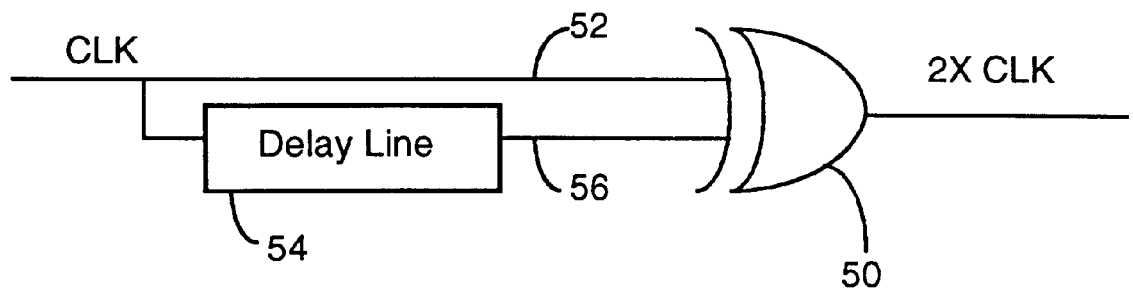
FIG. 1 illustrates a clock doubling circuit in accordance with the prior art.
Figure 2:
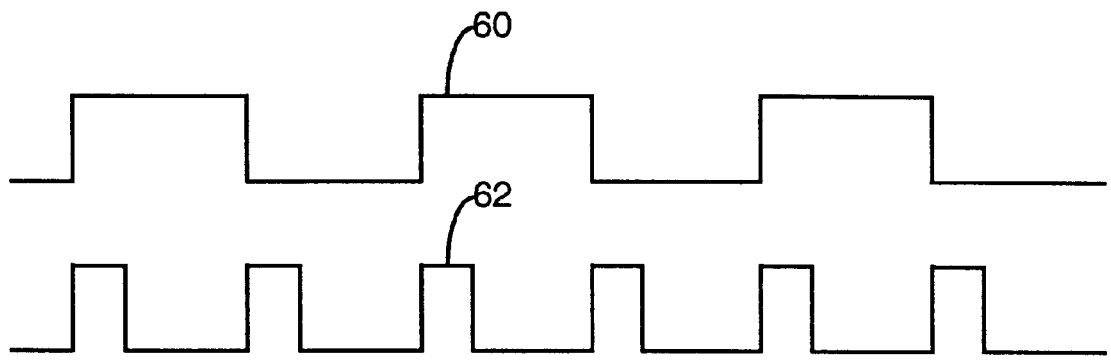
FIG. 2 illustrates waveforms associated with the clock doubling circuit of FIG. 1.
Figure 3:
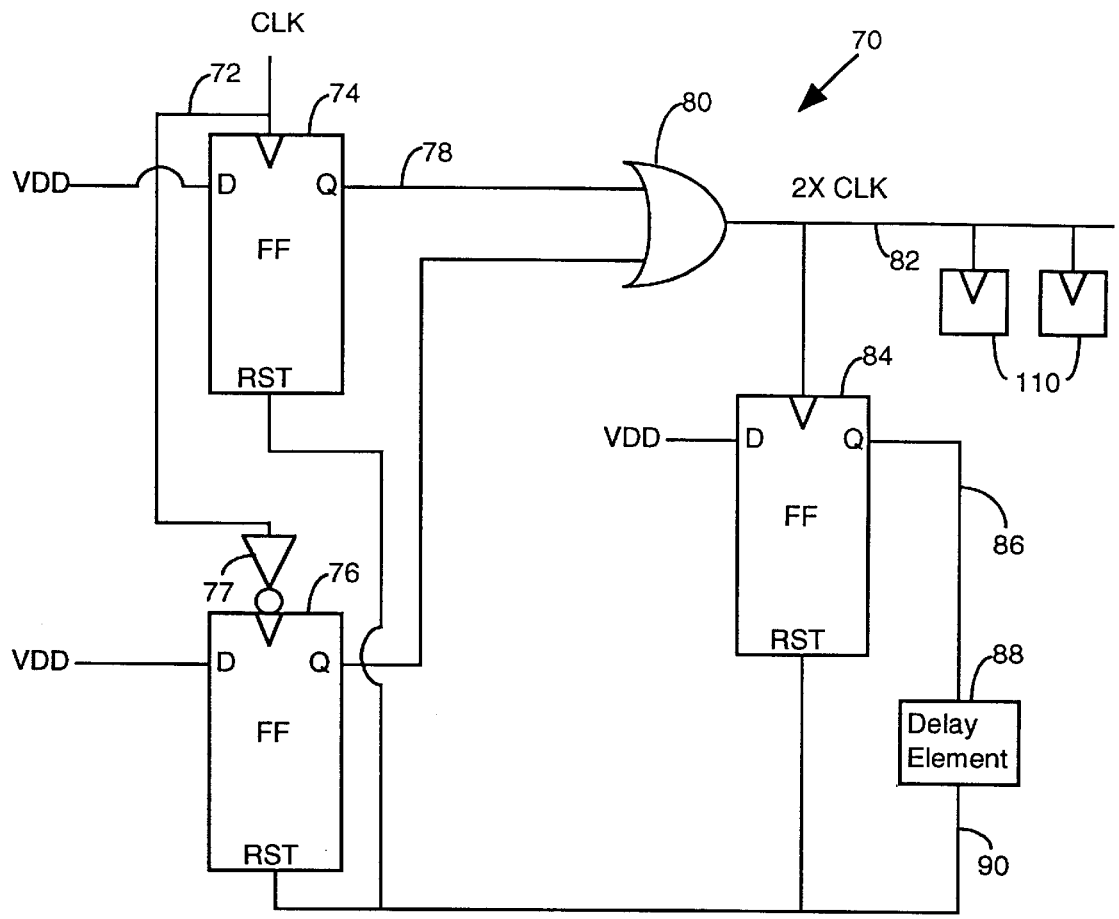
FIG. 3 illustrates a clock doubling circuit in accordance with an embodiment of the present invention.

FIG. 3 illustrates a circuit 70 for doubling the frequency of a periodic input signal. Typically, the periodic input signal will be in the form of a digital clock signal produced from a crystal or from a clock source with a 50% duty cycle.

The clock doubling circuit 70 receives an input signal, for example, in the form of a clock (CLK). The input signal is delivered via line 72 to an input stage circuit with a first flip-flop 74 and a second flip-flop 76. The input signal is inverted with an inverter 77 at the clock node of the second flip-flop 76. Alternately, the inverter 77 may be omitted and the clock source may provide standard and inverted signals for flip-flop 74 and flip-flop 76, respectively. The input node of the first flip-flop 74 and the input node of the second flip-flop 76 are tied to a logical one value $V_{DD}$.

Figure 4:
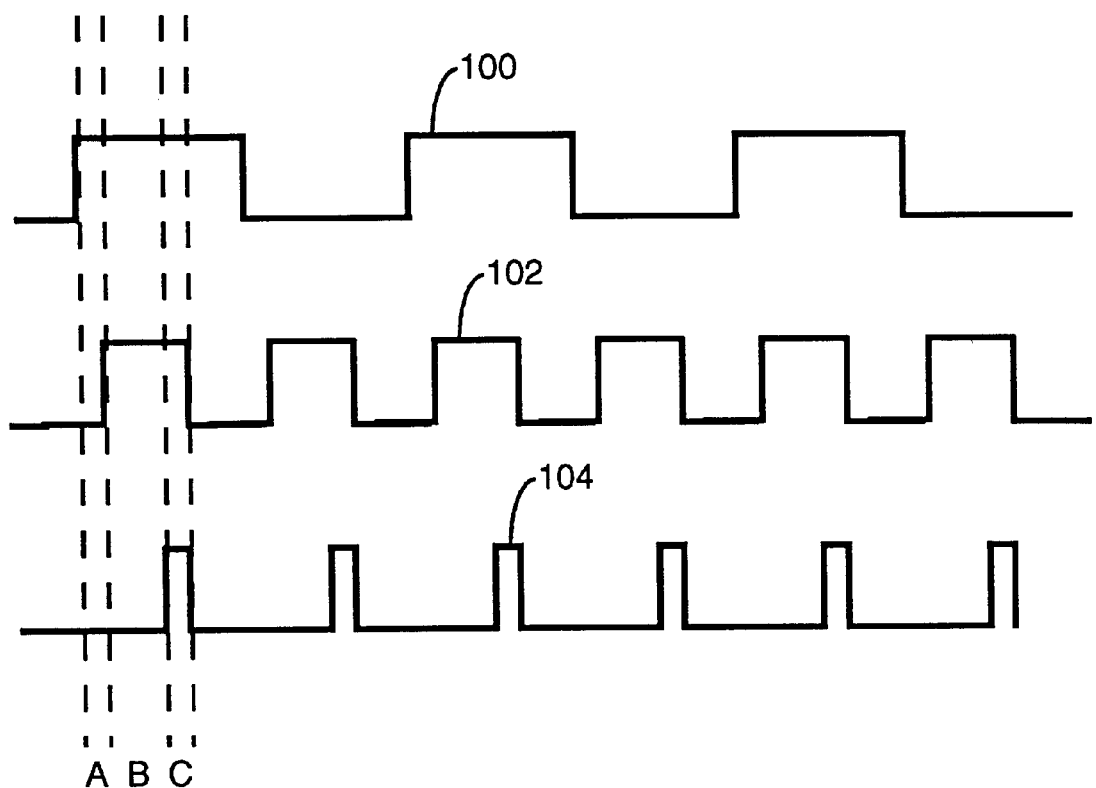
FIG. 4 illustrates waveforms associated with the clock doubling circuit of FIG. 3.

FIG. 4 illustrates an input signal 100 that is applied to line 72 of FIG. 3. The positive edge of the first cycle of the input signal 100 enables the flip-flop 74 to drive its digital high input signal $V_{DD}$ to its output node, which is connected to line 78. Line 78 is connected to an input node of logical OR gate 80. The digital high signal received by the logical OR gate 80 is driven onto the output node 82.

As shown in FIG. 4, after a short delay "A" following the positive edge of the first cycle of the input signal 100, a positive pulse edge is produced on the output node 82. The positive pulse edge is shown as an output signal waveform 102. The delay "A" is attributable to the "clock to Q" delay through flip-flop 74 plus the delay caused by the logical OR gate.

The output signal waveform is delivered to a reset stage including a third flip-flop 84. As with the other flip-flops, the input node of the third flip-flop is tied to a logical high value $V_{DD}$. After a "clock to Q" delay associated with flip-flop 84, a reset signal is driven onto node 86. FIG. 4 illustrates the "clock to Q" delay for flip-flop 84 as time period "B". FIG. 4 also illustrates the reset signal 104 that is driven onto node 86.

The reset signal is applied to an optional delay element 88, which may be implemented as a set of inverters. After progressing through the delay element 88, the reset signal operates as a feedback signal that terminates itself and the signal pulse of waveform 102. As seen in FIG. 3, the reset signal is routed on line 90 to each flip-flop 74, 76, and 84. By resetting flip-flop 74, the reset first pulse of the waveform 102 transitions. By resetting flip-flop 84, the reset pulse of the waveform 104 transitions. FIG. 4 illustrates that the reset signal 104 has a pulse width "C", which corresponds to the delay associated with the delay element 88 plus the internal delay of flip-flop 84 in responding to the reset signal. The flip-flops 74, 76, and 84 should be resettable.

The output signal 102 remains in a digital low state after it has been reset, as shown with waveform 102 in FIG. 4. The next transition of the output waveform 102 occurs after the input signal 100 transitions. When the input signal 100 transitions to a digital low state, the flip-flop 74 is disabled, while the flip-flop 76 is enabled since the input signal 100 is inverted via inverter 77. As a result, flip-flop 76 drives a digital high pulse through the OR gate 80. This digital high pulse is shown as the second pulse of waveform 102. The delay associated with the pulse and its subsequent processing is identical to the processing associated with the first pulse of the waveform 102. As shown with waveform 102, this results in a second pulse being formed during the initial cycle of the input waveform 100. Thus, a two cycle output signal is formed during the first cycle of the input signal. This processing is repeated for each subsequent cycle of the input signal.

Observe that the third flip-flop 84 controls the pulse width of the frequency doubled output clock 102. The Q output of the third flip-flop 84 is capable of resetting all three flip-flops 74, 76, and 84 after the pulse width of the output signal 102 is large enough to clock the D input of the third flip-flop 84 to its Q output. Observe that the third flip-flop 84 produces an adaptive pulse width which insures that all downstream flip-flops 110 connected to the output node 82 are able to clock new data into them. The adaptive pulse width results from the fact that the pulse width must be large enough to clock the D input of the third flip-flop 84 to its Q output, if this condition is satisfied at flip-flop 84, it will also be satisfied for the downstream flip-flops 110. Temperature, process, and voltage variations will be accommodated by the adaptive pulse width feature of the invention.

The optional delay element 88 extends the reset pulse width to ensure that all three flip-flops 74, 76, and 84 can be reset. Thus, the delay element 88 improves system reliability by ensuring that a more complete digital high signal has been output from the flip-flop 84, which in turn ensures a more solid 2× clock pulse width. Typically, a delay created by two inverters is adequate for the delay element 88. The delay from the delay element 88 also causes the pulse width of the frequency doubled clock 102 to be extended.

Figure 5:
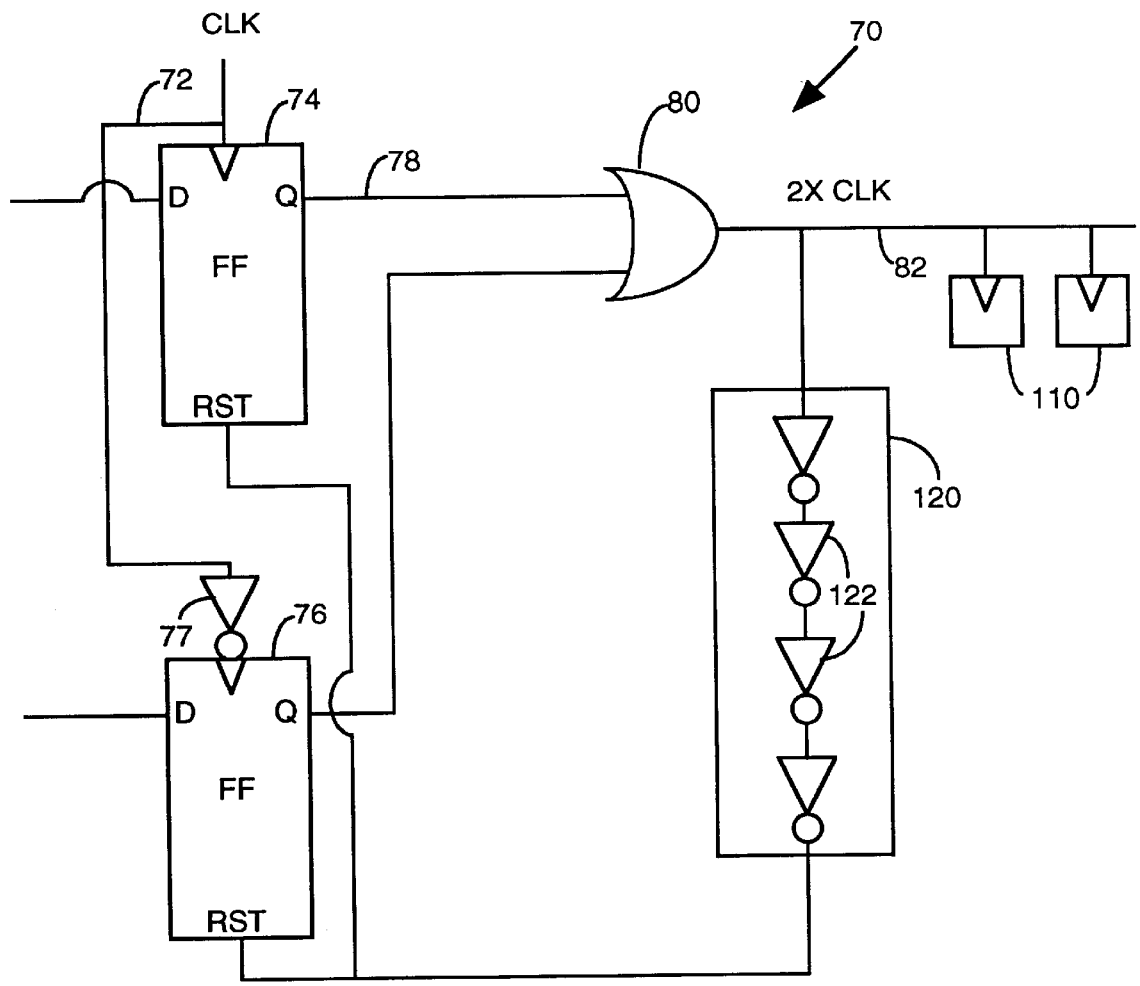
FIG. 5 illustrates a clock doubling circuit in accordance with a second embodiment of the present invention.

Those skilled in the art will appreciate that the third flip-flop 84 can be replaced with a delay path 120. By way of example, the delay path 120 may be implemented with a chain of inverters 122, as shown in FIG. 5. Observe that with an inverter implementation, an even number of inverters is required. In this embodiment, the delay path 120 creates the reset signal for flip-flops 74 and 76.

In sum, the invention uses a logical OR operation on an input clock and an inverted input clock to double the input clock frequency. A feedback flip-flop 84 adjusts the clock pulse width adaptively. The adaptivity makes the clock doubling scheme immune from temperature, voltage, and process variation.

Those skilled in the art will appreciate that the invention provides a clock doubling circuit that is relatively inexpensive to fabricate. The circuit utilizes standard components, such as flip-flops and a logical-OR gate for easy implementation. The circuit produces adaptive pulse widths that are immune from voltage, temperature, and process variations.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A method of doubling the frequency of an input clock signal, said methodcomprising the steps of:

generating a first signal pulse during a first half of a first cycle of said input clock signal;

producing a first reset signal in response to said first signal pulse, said first reset signal operating as a feedback signal that terminates said first signal pulse and said first reset signal;

forming a second signal pulse during a second half of a first cycle of said input clock signal; and providing a second reset signal in response to said second signal pulse, said second reset signal operating as a feedback signal that terminates said second signal pulse and said second reset signal, said first signal pulse and said second signal pulse thereby forming a two cycle output clock signal during said first cycle of said input clock signal.

2. The method of claim 1 wherein said producing step includes the step of delaying said first reset signal and said providing step includes the step of delaying said second reset signal.

3. The method of claim 1 further comprising the step of applying said two cycle output clock signal to a logic network of a digital control system.

4. A circuit for doubling the frequency of a periodic input signal, comprising:

an input stage to produce a first signal pulse during a first half of a first cycle of said periodic input signal and a second signal pulse during a second half of said first cycle of said periodic input signal; and a reset stage comprising a flip-flop to produce a first reset signal that terminates said first signal pulse and a second reset signal that terminates said second signal pulse, and a delay circuit positioned at an output of said flip-flop to delay said first reset signal and said second reset signal, said first signal pulse and said second signal pulse thereby forming a two cycle output signal during said first cycle of said periodic input signal.

5. The circuit of claim 4, wherein said flip-flop terminates said first reset signal in response to said first reset signal being directed back to said flip-flop as feedback and terminates said second reset signal in response to said second reset signal being directed back to said flip-flop as feedback.

6. The circuit of claim 4, wherein said reset stage produces said first reset signal when said first signal pulse achieves a predetermined width corresponding to a clock pulse width sufficient to drive an input signal from an input node to an output node of said flip-flop.

7. The circuit of claim 4 wherein said first input stage includes a first resettable flip-flop to produce said first signal pulse and a second resettable flip-flop to produce said second signal pulse.

8. The circuit of claim 7, wherein said first input stage includes a logical OR gate with a first input node connected to an output node of said first flip-flop, a second input node connected to an output node of said second flip-flop, and an output node connected to said reset stage.

9. A circuit for doubling the frequency of an input clock signal, comprising:

a first circuit comprising a resettable flip-flop to generate a first signal pulse during a first half of a first cycle of said input clock signal;

a second circuit comprising a resettable flip-flop to generate a second signal pulse during a second half of said first cycle of said input clock signal;

a third circuit to receive said first signal pulse and generate a first reset signal during said first half cycle of said input clock signal, which causes said first circuit to terminate said first signal pulse, and generate a second reset signal during said second half cycle of said input clock signal, which causes said second circuit to terminate said second signal pulse; and a logical OR gate with a first input node connected to an output node of said first circuit, a second input node connected to an output node of said second circuit, and an output node connected to a clock node of said third circuit, said first signal pulse and said second signal pulse thereby forming a two cycle output clock signal during said first cycle of said input clock signal.

10. A circuit for doubling the frequency of an input clock signal, comprising:

a first circuit to generate a first signal pulse during a first half of a first cycle of said input clock signal;

a second circuit to generate a second signal pulse during a second half of said first cycle of said input clock signal;

a third circuit to receive said first signal pulse and generate a first reset signal during said first half cycle of said input clock signal, which causes said first circuit to terminate said first signal pulse, and generate a second reset signal during said second half cycle of said input clock signal, which causes said second circuit to terminate said second signal pulse; and a delay circuit positioned at an output node of said third circuit to delay said first reset signal and said second reset signal, said first signal pulse and said second signal pulse thereby forming a two cycle output clock signal during said first cycle of said input clock signal.

11. A circuit for doubling the frequency of an input clock signal, comprising:

a first circuit to generate a first signal pulse during a first half of a first cycle of said input clock signal;

a second circuit to generate a second signal pulse during a second half of said first cycle of said input clock signal; and a third circuit to receive said first signal pulse and generate a first reset signal during said first half cycle of said input clock signal, which causes said first circuit to terminate said first signal pulse and said third circuit to terminate said first reset signal, and generate a second reset signal during said second half cycle of said input clock signal, which causes said second circuit to terminate said second signal pulse and said third circuit to terminate said second reset signal, said first signal pulse and said second signal pulse thereby forming a two cycle output clock signal during said first cycle of said input clock signal.

12. A circuit for doubling the frequency of an input clock signal, comprising:

a first circuit to generate a first signal pulse during a first half of a first cycle of said input clock signal;

a second circuit to generate a second signal pulse during a second half of said first cycle of said input clock signal; and a third circuit to receive said first signal pulse and generate a first reset signal that is produced when said first signal pulse achieves a predetermined width corresponding to a clock pulse width sufficient to drive an input signal from an input node to an output node of a flip-flop used to implement said third circuit during said first half cycle of said input clock signal, which causes said first circuit to terminate said first signal pulse, and generate a second reset signal during said second half cycle of said input clock signal, which causes said second circuit to terminate said second signal pulse, said first signal pulse and said second signal pulse thereby forming a two cycle output clock signal during said first cycle of said input clock signal.

13. A circuit for doubling the frequency of a periodic input signal, comprising:

an input stage to produce a first signal pulse during a first half of a first cycle of said periodic input signal and a second signal pulse during a second half of said first cycle of said periodic input signal; and a reset stage to produce a first reset signal that terminates said first signal pulse and said first reset signal and a second reset signal that terminates said second signal pulse and said second reset signal, said first signal pulse and said second signal pulse thereby forming a two cycle output signal during said first cycle of said periodic input signal.

14. The circuit of claim 13, wherein said first input stage includes a first resettable flip-flop to produce said first signal pulse and a second resettable flip-flop to produce said second signal pulse.

15. The circuit of claim 14, wherein said first input stage includes a logical OR gate with a first input node connected to an output node of said first flip-flop, a second input node connected to an output node of said second flip-flop, and an output node connected to said reset stage.

16. The circuit of claim 13, wherein said reset stage includes a third flip-flop to generate said first reset signal and said second reset signal.

17. The circuit of claim 16, further comprising a delay circuit positioned at an output node of said third flip-flop to delay said first reset signal and said second reset signal.

18. The circuit of claim 16, wherein said reset stage produces said first reset signal when said first signal pulse achieves a predetermined width corresponding to a clock pulse width sufficient to drive an input signal from an input node to an output node of said third flip-flop.

* * * * *